United States Patent
Seki

(10) Patent No.: US 7,154,350 B2
(45) Date of Patent: Dec. 26, 2006

(54) SEMICONDUCTOR DEVICE

(75) Inventor: Hiroshi Seki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 256 days.

(21) Appl. No.: 10/657,190

(22) Filed: Sep. 9, 2003

(65) Prior Publication Data

US 2004/0125645 A1    Jul. 1, 2004

(30) Foreign Application Priority Data

Sep. 11, 2002  (JP) .............................. 2002-265122

(51) Int. Cl.
*H03B 5/32*  (2006.01)

(52) U.S. Cl. ............ 331/158; 331/116 R; 331/116 FE; 331/74

(58) Field of Classification Search ............ 331/108 A, 331/116 FE, 116 R, 158, 74
See application file for complete search history.

(56) References Cited

U.S. PATENT DOCUMENTS 5,025,230 A * 6/1991 Kondo et al. .......... 331/116 FE

FOREIGN PATENT DOCUMENTS

| JP | A 1-117351 | 5/1989 |
|----|------------|--------|
| JP | A 2-10869 | 1/1990 |
| JP | A 7-221549 | 8/1995 |
| JP | A 9-64199 | 3/1997 |
| JP | A-2002-158288 | 5/2002 |

* cited by examiner

*Primary Examiner*—Arnold Kinkead
(74) *Attorney, Agent, or Firm*—Oliff & Berridge, PLC

(57) ABSTRACT

The invention provides technologies which can restrict damage due to static electricity to a gate insulating film of a transistor inside a semiconductor device forming an oscillating circuit. In particular, an oscillating circuit can include an oscillator and a semiconductor device which utilizes the oscillator. The semiconductor device can include an inverting amplifier which is provided in parallel with the oscillator and comprises an insulated gate type field effect transistor; a buffer circuit which includes an insulated gate type field effect transistor and is used to send out a signal output from the inverting amplifier to another circuit, and a transmission gate which is provided between the output terminal of the inverting amplifier and the input terminal of the buffer circuit, and includes an insulated gate type field effect transistor.

10 Claims, 6 Drawing Sheets

OUTSIDE THE IC | INSIDE THE IC

RELATED ART

SEMICONDUCTOR DEVICE

BACKGROUND OF THE INVENTION

1. Field of Invention

The present invention relates to the technology of an oscillating circuit having a semiconductor device.

2. Description of Related Art

Currently, MOS transistors are widely used in semiconductor devices, such as integrated circuits. A circuit inside a semiconductor device operates in response to a received clock signal. Accordingly, a quartz crystal oscillator is generally provided outside a semiconductor device, while an oscillating circuit including a quartz crystal oscillator is formed both inside and outside such a semiconductor device.

FIG. 6 is a diagram illustrating a basic configuration of a conventional oscillating circuit 900. As shown in the diagram, the oscillating circuit 900 includes a quartz crystal oscillator 910, a feedback resistor 920 connected in parallel to the quartz crystal oscillator, an inverting amplifier 960 connected in parallel to the quartz crystal oscillator, and a buffer circuit 970 connected to the output terminal of the inverting amplifier. In FIG. 6, the quartz crystal oscillator 910 and the feedback resistor 920 are provided outside a semiconductor device 950. Meanwhile, the inverting amplifier 960 and the buffer circuit 970 are provided inside the semiconductor device 950 and each comprise an MOS transistor.

SUMMARY OF THE INVENTION

MOS transistors have been greatly developed in miniaturization over recent years. In line with this trend, a gate oxide film in a transistor becomes thinner. Making a gate oxide film thinner lowers the withstand voltage of the film. Therefore, as regards an oscillating circuit having an MOS transistor including a comparatively thin gate oxide film, the gate oxide film of the transistor can be easily damaged when a comparatively high voltage is applied to pins P1 and P2 provided in the semiconductor device 950 because of static electricity.

In order to solve the above-mentioned problem in prior art, an object of the present invention is to provide a technology which can restrict damage due to static electricity to a gate insulating film of a transistor inside a semiconductor device forming an oscillating circuit.

To solve at least part of the above-mentioned problem, a first device according to the present invention is a semiconductor device utilizing an oscillator installed outside. The device can include an inverting amplifier which is provided in parallel with the oscillator and having an insulated gate type field effect transistor, and a buffer circuit which comprises an insulated gate type field effect transistor and is used to send out a signal output from the inverting amplifier to another circuit. The device can further include a transmission gate which is provided between the output terminal of the inverting amplifier and the input terminal of the buffer circuit, and comprises an insulated gate type field effect transistor.

Since this device is equipped with the transmission gate, utilizing an on-state resistance of the transmission gate can restrict damage due to static electricity to a gate insulating film of a transistor included in the buffer circuit.

The above-mentioned device preferably includes a CMOS transmission gate formed with an n-channel MOS transistor and a p-channel MOS transistor in combination. This enables transmission property from the inverting amplifier to the buffer circuit to be highly improved.

Alternatively, the transmission gate may include either an n-channel MOS transistor or a p-channel MOS transistor.

In the above-mentioned device, the transmission gate is preferably set "on" constantly. This makes it possible to omit the control of the transmission gate.

Moreover, the above-mentioned device preferably includes a first resistor connected to the input terminal of the inverting amplifier. The first resistor and the inverting amplifier, which are connected together in series, are preferably provided in parallel with the oscillator. This can enable the first resistor to restrict damage due to static electricity to the gate insulating film of the transistor included in the inverting amplifier.

Furthermore, the above-mentioned device preferably includes a second resistor connected to the output terminal of the inverting amplifier. The first resistor, the inverting amplifier, and the second resistor, all of which are connected together in series, are preferably provided in parallel with the oscillator. This can enable the second resistor to protect the transmission gate from static electricity.

In the above-mentioned device, the semiconductor device preferably utilizes the oscillator and a feedback resistor provided in parallel with the oscillator. Here, the feedback resistor may be provided outside the semiconductor device. Using a feedback resistor as forementioned can oscillate the oscillator without fail.

A second device according to the present invention is an oscillating circuit having an oscillator, and a semiconductor device which utilizes the oscillator. The semiconductor device can include an inverting amplifier which is provided in parallel with the oscillator and includes an insulated gate type field effect transistor, a buffer circuit which includes an insulated gate type field effect transistor and is used to send out a signal output from the inverting amplifier to another circuit, and a transmission gate which is provided between the output terminal of the inverting amplifier and the input terminal of the buffer circuit, and has an insulated gate type field effect transistor.

Since this device, like the first device, is equipped with the transmission gate, utilizing an on-state resistance of the transmission gate can restrict damage due to static electricity to the gate insulating film of the transistor included in the buffer circuit.

The present invention can be put into practice in various modes, such as a semiconductor device, an oscillating circuit including a semiconductor device, and electrical equipment including such an oscillating circuit.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

An oscillating circuit of a comparative example is described below, followed by the description of an oscillating circuit to which the present invention is applied.

Figure 1:
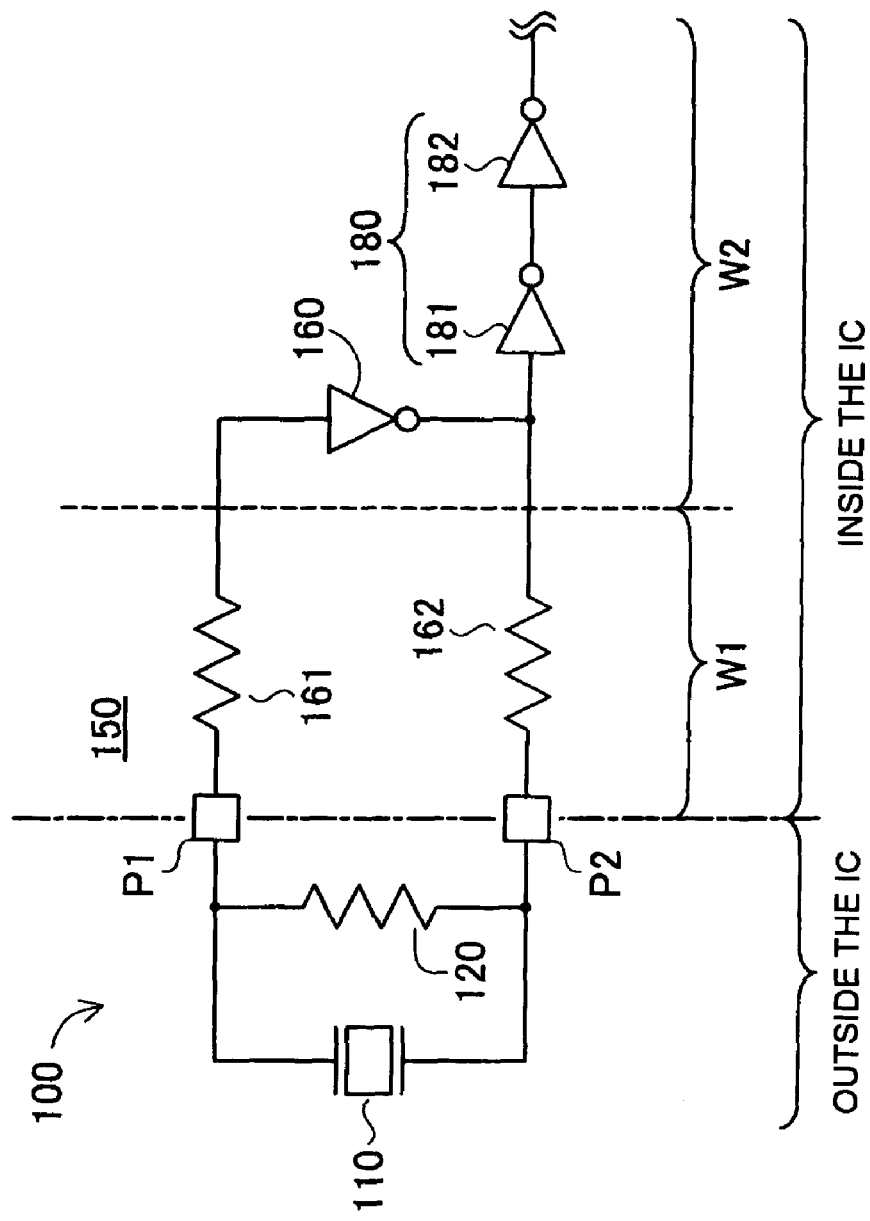
FIG. 1 is a diagram illustrating an oscillating circuit 100 in the comparative example.

FIG. 1 is a diagram illustrating an oscillating circuit 100 in a comparative example. As shown in the diagram, the oscillating circuit 100 can include a semiconductor device 150.

The oscillating circuit 100 can include a quartz crystal oscillator 110 and a feedback resistor 120 connected in parallel to the quartz crystal oscillator. The oscillating circuit 100 also includes a first resistor 161, an inverting amplifier 160, and a second resistor 162, all of which are connected together in series. The first resistor 161, the inverting amplifier 160, and the second resistor 162, all of which are connected together in series, are connected in parallel to the quartz crystal oscillator 110. The oscillating circuit 100 also includes a buffer circuit 180 connected to the output terminal of the inverting amplifier 160. The buffer circuit 180 includes two inverters 181 and 182 which are connected together in series.

This configuration allows the oscillating circuit 100 to generate a clock signal. Specifically, the quartz crystal oscillator 110 oscillates, and then the inverting amplifier 160 sends out an oscillation signal which is obtained by inverting a logical level of a feedback signal provided by the quartz crystal oscillator. The buffer circuit 180 has a function that regularizes a waveform of the generated oscillation signal and supplies the clock signal to another circuit (such as a frequency divider) inside the semiconductor device 150.

In FIG. 1, the quartz crystal oscillator 110 and the feedback resistor 120 are provided outside the semiconductor device 150, while the inverting amplifier 160, the two resistors 161 and 162, and the buffer circuit 180 are provided inside the semiconductor device 150. Here, the inside and the outside of the semiconductor device 150 are electrically connected through a plurality of pins provided in the semiconductor device 150. As regards the oscillating circuit 100 shown in FIG. 1, the portion of the circuit outside the semiconductor device 150 and the portion of the circuit inside the semiconductor device 150 are electrically connected through two pins P1 and P2 connected to the quartz crystal oscillator 110.

In this example, a gate array is used as the semiconductor device 150. The gate array is a device which is categorized as a semi-custom IC among application specific integrated circuits (ASIC). The semiconductor device 150 can include an input and output area W1 which serves as an interface between the inside and the outside of the semiconductor device 150 and an internal cell area W2 where basic cells are arranged in a matrix. The basic cells include a p-channel MOS transistor (hereinafter called p-MOS transistor) and an n-channel MOS transistor (hereinafter called n-MOS transistor).

The two resistors 161 and 162 are provided in the I/O area W1 of the semiconductor device 150. The two resistors 161 and 162 are diffused resistors (also known as diffused-layer resistors). Here, the diffused resistor means a resistive element which utilizes the layered resistance of a diffused layer formed in or on a semiconductor substrate.

Moreover, the inverting amplifier 160 and the buffer circuit 180 are provided in the internal cell area W2 of the semiconductor device 150. The inverting amplifier 160 and the two inverters 181 and 182 included in the buffer circuit 180 each include, for example, a CMOS inverter circuit.

Figure 2:
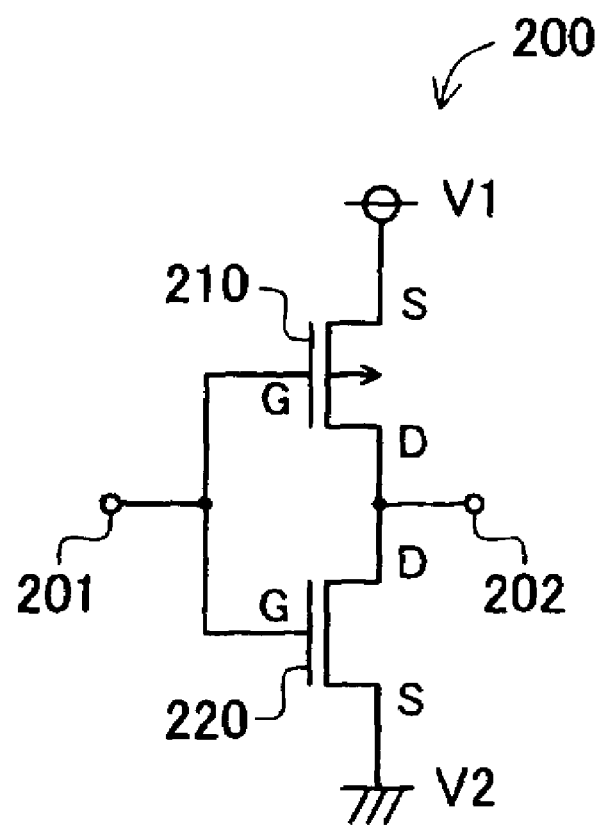
FIG. 2 is a diagram illustrating a specific circuit configuration of a CMOS inverter circuit.

FIG. 2 is a diagram illustrating a specific circuit configuration of a CMOS inverter circuit. As shown in the diagram, a CMOS inverter circuit 200 can include a p-MOS transistor 210 and an n-MOS transistor 220 which are connected together in series. Each gate of the p-MOS transistor 210 and the n-MOS transistor 220 is connected to the other, thereby functioning as an input terminal 201. At the same time, each drain of the p-MOS transistor 210 and the n-MOS transistor 220 is connected to the other, thereby functioning as an output terminal 202. A source of the p-MOS transistor 210 is set at a first internal power supply the voltage V1 of the semiconductor device 150, while a source of the n-MOS transistor 220 is set at a second internal power supply the voltage V2 (shown as a ground potential in FIG. 2) of the semiconductor device 150. This configuration allows the CMOS inverter circuit 200 to output a signal, obtained by inverting a logical level of a signal input by the input terminal 201, from the output terminal 202. Specifically, when an input is at the H-level, only the n-MOS transistor 220 is in an "on" state, and thereby output is at the L-level. On the contrary, when an input is at the L-level, only the p-MOS transistor 210 is in an "on" state, and thereby output is at the H-level.

The first resistor 161 is connected to the input terminal of the inverting amplifier 160 (FIG. 1), while the second resistor 162 is connected to the input terminal of the first inverter 181 of the input stage of the buffer circuit 180. Consequently, even if a comparatively high voltage due to static electricity is applied to the two pins P1 and P2 of the semiconductor device 150, the damage to a gate oxide film of the CMOS inverter circuit can be restricted. Specifically, when a comparatively high voltage is applied to the first pin P1, the first resistor 161 restricts damage to a gate oxide film of the inverting amplifier 160. When a comparatively high voltage is applied to the second pin P2, the second resistor 162 restricts damage to a gate oxide film of the first inverter 181.

In FIG. 1, the resistance of the second resistor 162 is set to be smaller than that of the first resistor 161. For example, the first resistor 161 is set to about 300 to 1000 Ω, while the second resistor 162 is set to about 10 to 50 Ω. The resistance of the second resistor 162 is set to comparatively be small so as to make an output impedance of the inverting amplifier 160, which operates at comparatively high frequencies, comparatively low.

As forementioned, a gate oxide film in a transistor becomes thinner in line with the miniaturization of MOS transistors. Consequently, when forming the oscillating circuit 100 shown in FIG. 1 by using a transistor including a comparatively thin gate oxide film, a gate oxide film of the first inverter 181 connected to the second resistor 162 with a comparatively small resistance can be easily damaged by static electricity and so forth.

The following examples solve the above-mentioned problem by improving the configuration of an oscillating circuit.

Figure 3:
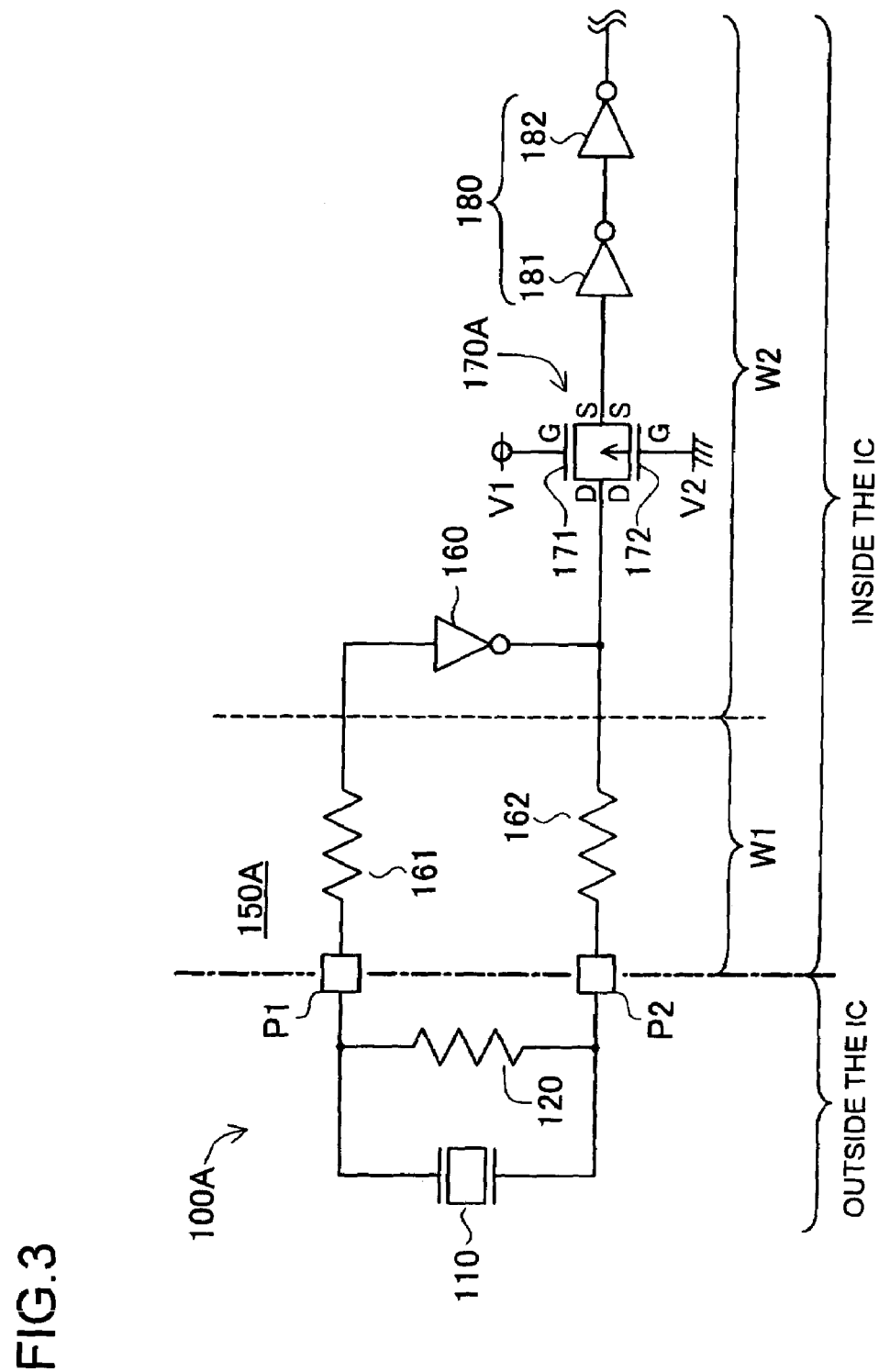
FIG. 3 is a diagram illustrating an oscillating circuit 100A in the first example.

FIG. 3 is a diagram illustrating an oscillating circuit 100A in a first example. The oscillating circuit 100A in this example is almost the same as the oscillating circuit 100 in the comparative example (FIG. 1), except that a semiconductor device 150A can include a transmission gate 170A between the inverting amplifier 160 and the buffer circuit 180 in this example. The transmission gate is also known as a transfer gate or a pass transistor.

The transmission gate 170A is a CMOS transmission gate formed with an n-MOS transistor 171 and a p-MOS transistor 172 in combination. Each drain of the n-MOS transistor 171 and the p-MOS transistor 172 is connected to the other, thereby functioning as an input terminal. At the same time, each source of the n-MOS transistor 171 and the p-MOS transistor 172 is connected to the other, thereby functioning as an output terminal. A gate of the n-MOS transistor 171 is set at the first internal supply the voltage V1 of the semiconductor device 150. Therefore, the n-MOS transistor 171 is constantly "on". Meanwhile, a gate of the p-MOS transistor 172 is set at the second internal power supply voltage V2 (set as a ground potential in this example) of the semiconductor device 150. Therefore, the p-MOS transistor 172 is also constantly "on". This means that the transmission gate 170A is constantly set "on" as far as power is supplied to the semiconductor device 150. At the same time, a voltage supplied to the input terminal of the transmission gate 170A is output from the output terminal, keeping its voltage value almost unchanged.

The transmission gate 170A has a comparatively high on-state resistance. Consequently, when a comparatively high voltage due to static electricity is applied to the second pin P2 of the semiconductor device 150, the transmission gate 170A restricts damage to a gate oxide of the first inverter 181 included in the buffer circuit 180.

The on-state resistance of the transmission gate 170A is preferably set to from about 300 to 1000 Ω, and desirably from about 500 to 1000 Ω. The on-state resistance is variable depending on a gate voltage of a transmission gate, and the size of a transmission gate such as the gate length and the gate width.

In this example, like the comparative example (shown in FIG. 1), although the semiconductor device 150A can include the first resistor 161, the first resistor 161 can be omitted in terms of circuit operation. Using the first resistor 161, however, can restrict damage due to static electricity to a gate oxide film in a transistor included in the inverting amplifier 160.

Also in this example, like the comparative example (shown in FIG. 1), although the semiconductor device 150A can include the second resistor 162 set at a comparatively low resistance value so as to make an output impedance of the inverting amplifier 160 comparatively low, the second resistor 162 can be omitted in terms of circuit operation. Using the second resistor 162, however, can protect the transmission gate 170A from static electricity.

As mentioned above, the oscillating circuit 100A in this example includes the quartz crystal oscillator 110 and the semiconductor device 150A which utilizes the quartz crystal oscillator. Furthermore, the semiconductor device 150A is provided in parallel with the quartz crystal oscillator 110 and includes the inverting amplifier 160 including a CMOS inverter circuit, the buffer circuit 180 which comprises a CMOS inverter circuit and is used to send out a signal output from the inverting amplifier to another circuit, and the CMOS transmission gate 170A which is provided between the output terminal of the inverting amplifier 160 and the input terminal of the buffer circuit 180. If the configuration of this example is adopted, the damage to a gate oxide film of the CMOS inverter circuit included in the buffer circuit 180 can be restricted by utilizing the on-state resistance of the CMOS transmission gate 170A.

Furthermore, although in this example, the transmission gate 170A is provided between the inverting amplifier 160 and the buffer circuit 180, the transmission gate 170A is replaceable with, for example, a resistor, such as a diffused resistor. However, it is necessary to have a comparatively large area inside the semiconductor device 150 to form a diffused resistor which has a comparatively high resistance value. In addition, when replacing the transmission gate 170A with a diffused resistor in a gate array, the configuration of the diffused resistor is limited, and thus the configuration of the oscillating circuit is undesirably limited. In other words, utilizing the on-state resistance of the transmission gate 170A like this example provides an advantage of enhancing versatility in arrangement of the oscillating circuit in a gate array, as well as an advantage of providing a comparatively high resistance value in a comparatively small area.

Figure 4:
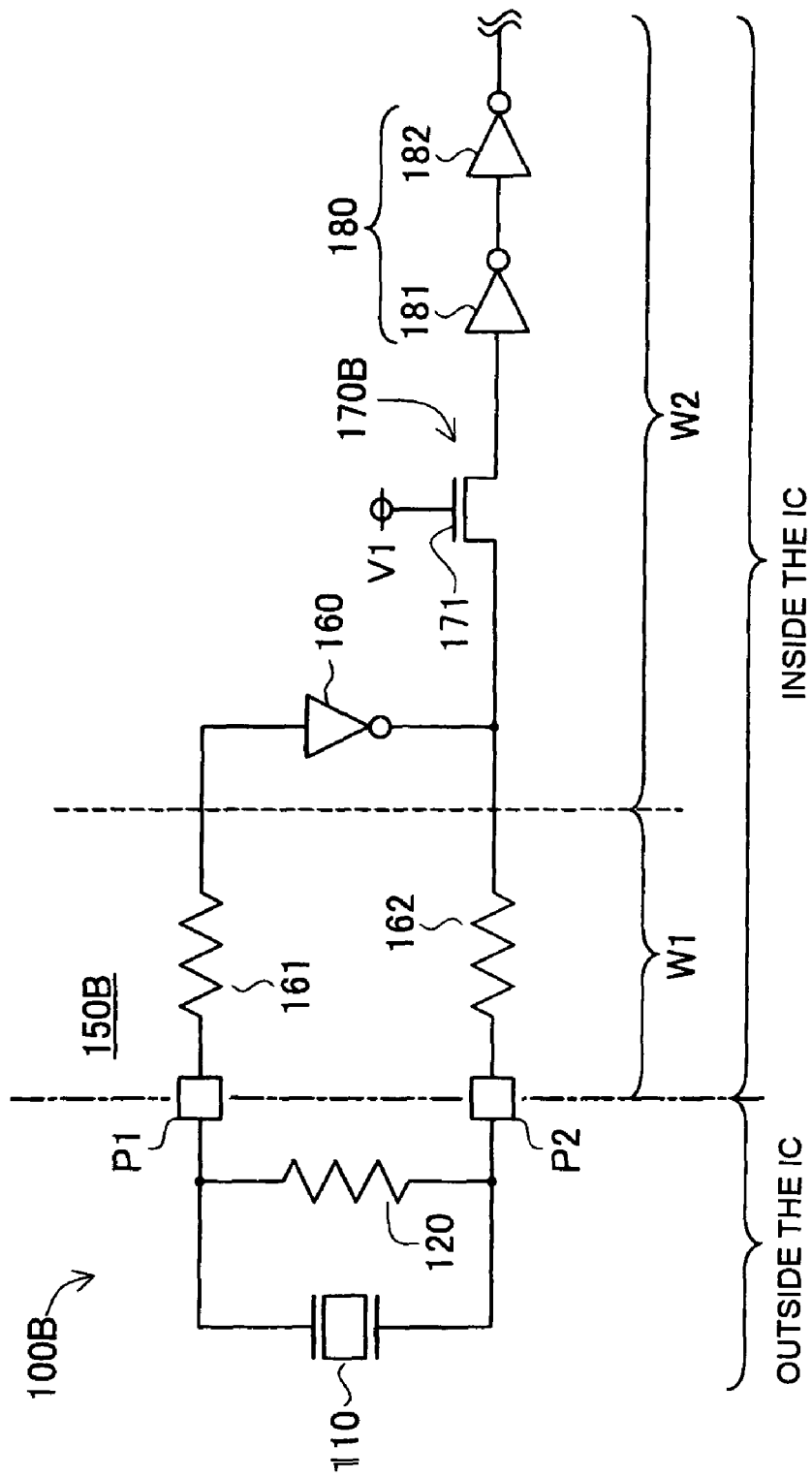
FIG. 4 is a diagram illustrating a first oscillating circuit 100B in the second example.

FIG. 4 is a diagram illustrating a first oscillating circuit 1001B in a second example. The oscillating circuit 1001B is almost the same as the oscillating circuit 100A in the first example (FIG. 3), except that a semiconductor device 150B includes a transmission gate 170B including only the n-MOS transistor 171 in this example.

Figure 5:
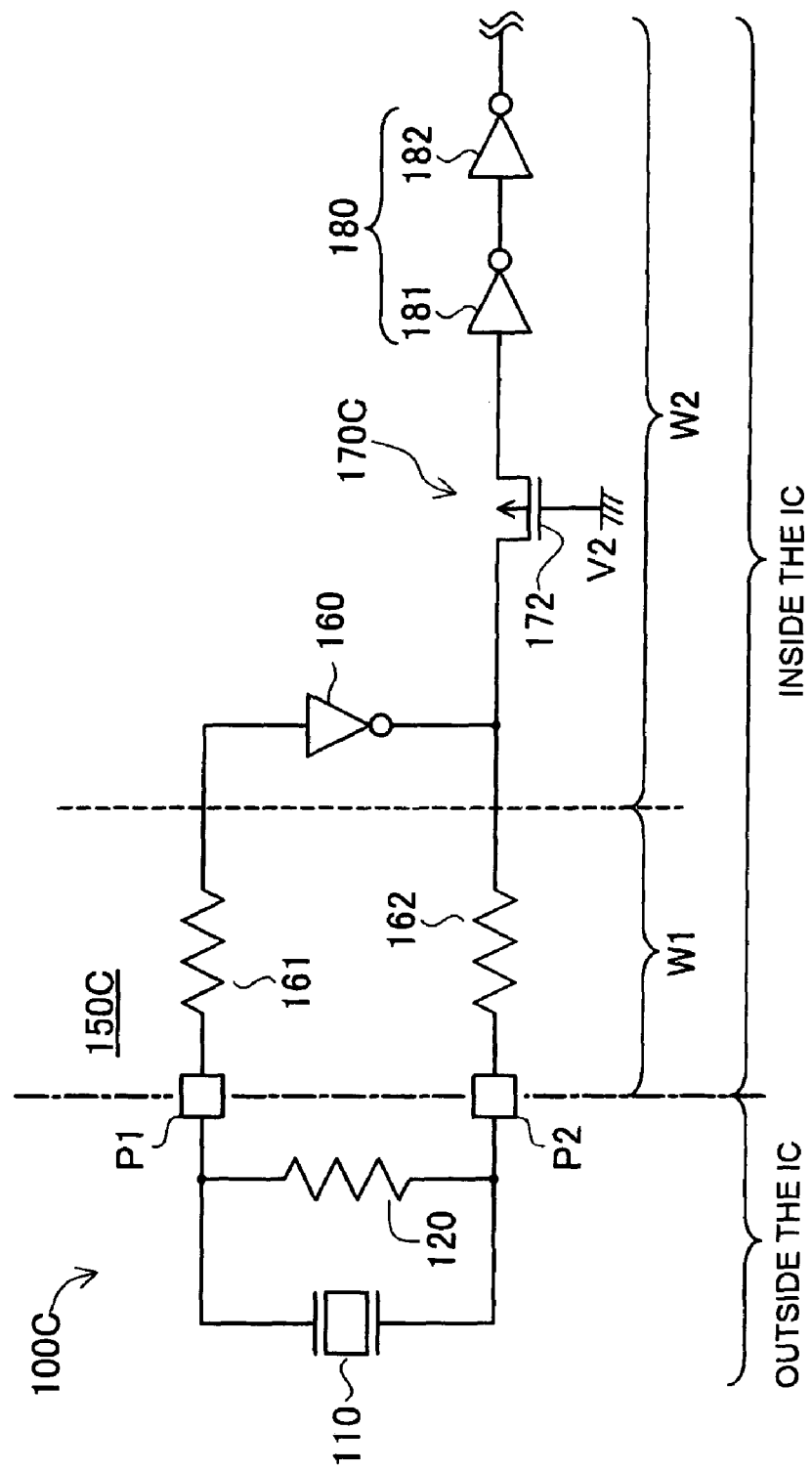
FIG. 5 is a diagram illustrating a second oscillating circuit 100C in the second example.
Figure 6:
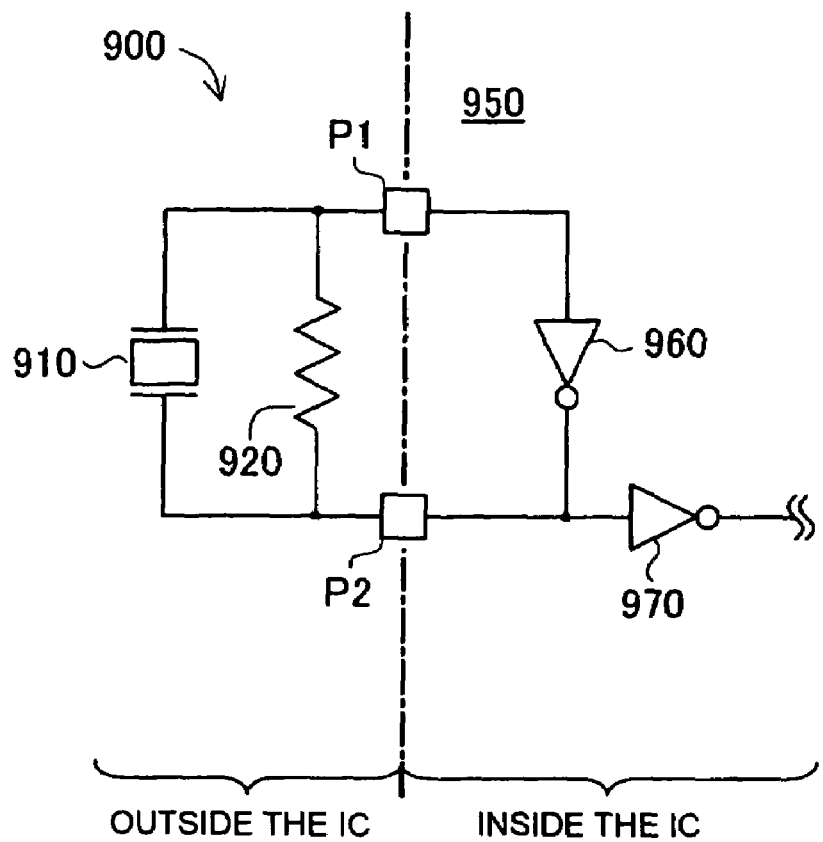
FIG. 6 is a diagram illustrating a basic configuration of a conventional oscillating circuit 900.

FIG. 5 is a diagram illustrating a second oscillating circuit 100C in the second example. The oscillating circuit 100C is also almost the same as the oscillating circuit 100A in the first example (FIG. 3), except that a semiconductor device 150C comprises a transmission gate 170C including only the p-MOS transistor 172 in this example.

Adopting the configuration of this example (FIGS. 4 and 5), same as adopting the configuration of the first example (FIG. 3), can restrict damage due to static electricity to a gate oxide film of a CMOS inverter circuit included in the buffer circuit 180.

However, the transmission gate 170B shown in FIG. 4 is superior in transmission property for an input at the L-level but is inferior in transmitting an input at the H-level. This is because the output voltage of the n-MOS transistor 171 is limited at and below the value (obtained by subtracting a threshold voltage from a gate voltage). On the contrary, the transmission gate 170C shown in FIG. 5 is superior in transmitting an input at the H-level but is inferior in transmitting an input at the L-level. This is because an output voltage of the p-MOS transistor 172 is limited at and above the value (obtained by adding a gate voltage to a threshold voltage). Meanwhile, since the transmission gate 170A shown in FIG. 3 utilizes the advantages of the two transistors 171 and 172, the transmission gate 170A is superior in transmitting inputs at both the L-level and the H-level. In other words, adopting the transmission gate 170A shown in FIG. 3 has an advantage of providing good property of transmitting an input from an inverting amplifier to a buffer circuit.

Moreover, it should be understood that the present invention is not limited to the above embodiment and examples, and can be applied in various modes without departing from the spirit and scope of the invention. For example, the following applications are also acceptable.

Although in the above examples, the quartz crystal oscillator 110 is used independently, a load capacitance may be connected to the quartz crystal oscillator 110. Also in the above examples, the oscillating circuit 100 comprises the quartz crystal oscillator 110, which may be replaced with a ceramic oscillator composed of PZT, PbTiO3, and so forth. In general, an oscillating circuit has only to include an oscillator.

Although in the above examples, the feedback resistor 120 is provided outside the semiconductor device 150, the feedback resistor may be provided inside the semiconductor device. Also, the feedback resistor 120 may be omitted, although utilizing a feedback resistor like in the above examples make it possible to oscillate an oscillator without fail.

Although in the above examples, the gate of the transmission gate is set at the internal power supply voltage of the semiconductor device, other voltages may be also applied. Also in the above examples, the gate of the transmission gate is constantly "on" however, a gate voltage of the transmission gate may be changed by using another transistor so as to enable "on" and "off" states of the transmission gate to be controlled. However, adopting the above examples has an advantage of omitting the control of the transmission gate.

In the above examples, the inverting amplifier 160 and the two inverters 181 and 182 forming the buffer circuit 180 are CMOS inverter circuits including a set of a p-MOS transistor and an n-MOS transistor, respectively. Alternatively, an inverter circuit whose p-MOS transistor is replaced by a resistor such as a diffused resistor may be used. Furthermore, a 2-input NAND gate including two sets of a p-MOS transistor and an n-MOS transistor may be used. In this case, for example, two input terminals of the NAND gate may be connected each other. Also, one of the input terminals of the NAND gate may receive a control signal which controls operations of the NAND gate. In particular, it is sufficient for the inverting amplifier to perform the "NOT" logical function.

Also in the above examples, the semiconductor device 150 includes the MOS transistor with a gate insulating film formed by an oxide film, which may be replaced by an MIS transistor including a gate insulating film formed by another insulating film such as a nitride film. Also, the gate of the transistor may be composed of polysilicon.

Also in the above examples, the gate array is used as the semiconductor device 150, which may be replaced by another integrated circuit.

In general, it is sufficient for a semiconductor device to include a plurality of insulated gate type field effect transistors. At the same time, it is sufficient for an inverting amplifier, a buffer circuit, and a transmission gate to have at least one insulated gate type field effect transistor.

While this invention has been described in conjunction with specific embodiments thereof, it is evident that many alternatives, modifications, and variations will be apparent to those skilled in the art. Accordingly, preferred embodiments of the invention as set forth herein are intended to be illustrative, not limiting. Various changes may be made without departing from the spirit and scope of the invention.

What is claimed is:

1. A semiconductor device utilizing an oscillator installed outside, and comprising:
    an inverting amplifier which is provided in parallel with the oscillator and includes an insulated gate type field effect transistor;
    a buffer circuit which includes an insulated gate type field effect transistor and transmits a signal output from the inverting amplifier to another circuit;
    a transmission gate which is installed between an output terminal of the inverting amplifier and an input terminal of the buffer circuit, and includes an insulated gate type field effect; and a resistor that protects the transmission gate from static electricity.

2. The semiconductor device according to claim 1, the transmission gate being a CMOS transmission gate formed with an n-channel MOS transistor and a p-channel MOS transistor in combination.

3. The semiconductor device according to claim 1, the transmission gate comprising an n-channel MOS transistor.

4. The semiconductor device according to claim 1, the transmission gate comprising a p-channel MOS transistor.

5. The semiconductor device according to claim 1, the transmission gate being set "on" constantly.

6. The semiconductor device according to claim 1, further comprising an additional resistor coupled to an input terminal of the inverting amplifier, the first resistor and the inverting amplifier, which are coupled together in series, being provided in parallel with the oscillator.

7. The semiconductor device according to claim 6, the resistor being coupled to the output terminal of the inverting amplifier, the additional resistor, the inverting amplifier and the resistor, all of which are coupled together in series, being provided in parallel with the oscillator.

8. The semiconductor device utilizing the oscillator according to claim 1, further comprising a feedback resistor provided in parallel with the oscillator.

9. The semiconductor device according to claim 8, the feedback resistor being provided outside the semiconductor device.

10. An oscillating circuit, comprising:
    an oscillator; and
    a semiconductor device which utilizes the oscillator;
    the semiconductor device including:
        an inverting amplifier which is provided in parallel with the oscillator and includes an insulated gate type field effect transistor;
        a buffer circuit which includes an insulated gate type field effect transistor and is used to send out a signal output from the inverting amplifier to another circuit;
        a transmission gate which is provided between the output terminal of the inverting amplifier and the input terminal of the buffer circuit, and includes an insulated gate type field effect; and a resistor that protects the transmission gate from static electricity.

* * * * *